US010386013B2

(12) United States Patent
Walker et al.

(10) Patent No.: US 10,386,013 B2
(45) Date of Patent: Aug. 20, 2019

(54) ENCLOSURE MOUNTING ASSEMBLY

(71) Applicant: PHOENIX CONTACT DEVELOPMENT AND MANUFACTURING, INC., Middletown, PA (US)

(72) Inventors: Kevin Walker, Hershey, PA (US); Nathan Potteiger, Middletown, PA (US)

(73) Assignee: Phoenix Contact Development and Manufacturing, Inc., Middletown, PA (US)

(*) Notice: Subject to any disclaimer, the term of this patent is extended or adjusted under 35 U.S.C. 154(b) by 14 days.

(21) Appl. No.: 15/431,893

(22) Filed: Feb. 14, 2017

(65) Prior Publication Data
US 2018/0231175 A1 Aug. 16, 2018

(51) Int. Cl.
F16M 13/02 (2006.01)
H05K 5/02 (2006.01)

(52) U.S. Cl.
CPC .......... F16M 13/02 (2013.01); H05K 5/0204 (2013.01)

(58) Field of Classification Search
CPC .............................. F16M 13/02; H05K 5/0204
USPC ............................... 248/218.4, 227.3, 283.1
See application file for complete search history.

(56) References Cited

U.S. PATENT DOCUMENTS

| 5,181,774 | A | * | 1/1993 | Lane | B62J 6/02 |
| | | | | | 224/421 |
| 5,927,931 | A | | 7/1999 | Raben | |
| 6,052,282 | A | | 4/2000 | Sugiyama et al. | |
| 6,135,624 | A | | 10/2000 | Masters et al. | |
| 6,486,399 | B1 | * | 11/2002 | Armstrong | H05K 5/0204 |
| | | | | | 174/58 |
| 6,969,034 | B2 | * | 11/2005 | Ware | F16L 3/137 |
| | | | | | 248/218.4 |
| 7,059,572 | B2 | | 6/2006 | Ware et al. | |
| 7,477,824 | B2 | | 1/2009 | Reagan et al. | |
| 9,388,937 | B2 | * | 7/2016 | Shimizu | B60R 16/0238 |
| 9,605,798 | B2 | * | 3/2017 | Brown | F16M 13/02 |
| 9,782,023 | B2 | * | 10/2017 | Fattahi | A47G 1/17 |
| 2005/0029419 | A1 | * | 2/2005 | Ware | F16L 3/137 |
| | | | | | 248/218.4 |
| 2005/0151846 | A1 | | 7/2005 | Thornhill | |
| 2005/0288071 | A1 | * | 12/2005 | Wu | H05K 5/0204 |
| | | | | | 455/575.1 |
| 2007/0018067 | A1 | * | 1/2007 | Huang | H05K 5/0204 |
| | | | | | 248/346.03 |
| 2013/0006435 | A1 | | 1/2013 | Berrios et al. | |
| 2015/0007432 | A1 | | 1/2015 | Rehsi | |
| 2016/0037662 | A1 | * | 2/2016 | Terao | F16M 11/00 |
| | | | | | 248/283.1 |

FOREIGN PATENT DOCUMENTS

| CN | 2901503 Y | 4/2006 |
| CN | 202691509 U | 3/2012 |
| CN | 202691532 U | 6/2012 |
| CN | 203147227 U | 4/2013 |
| CN | 203604941 U | 10/2013 |
| CN | 203703549 U | 7/2014 |

(Continued)

Primary Examiner — Muhammad Ijaz
(74) Attorney, Agent, or Firm — Hooker & Habib, P.C.

(57) ABSTRACT

An enclosure mounting assembly for mounting different sized enclosures onto support poles or flat support walls.

26 Claims, 13 Drawing Sheets

(56) References Cited

FOREIGN PATENT DOCUMENTS

| | | |
|---|---|---|
| CN | 204879317 U | 4/2015 |
| CN | 205560200 U | 1/2016 |
| CN | 205402172 U | 2/2016 |
| CN | 205447194 U | 8/2016 |
| WO | 2016197744 A1 | 4/2016 |

* cited by examiner

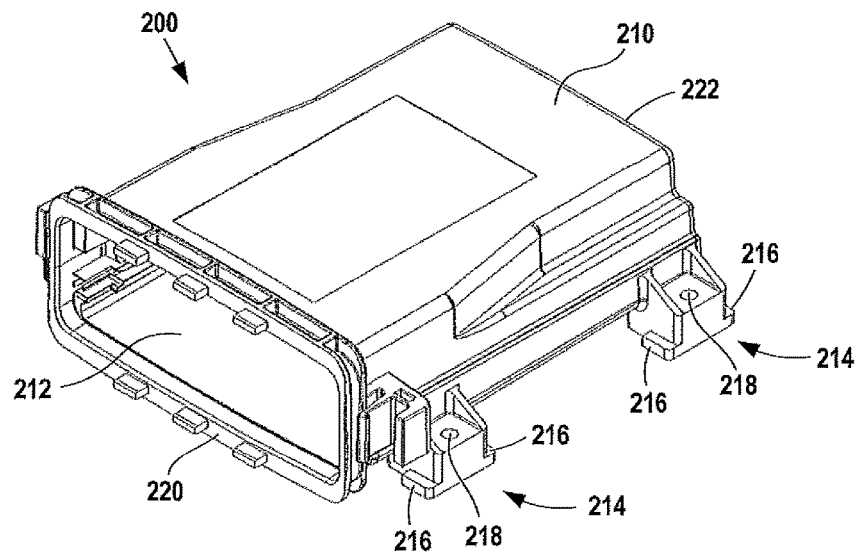
FIG. 18
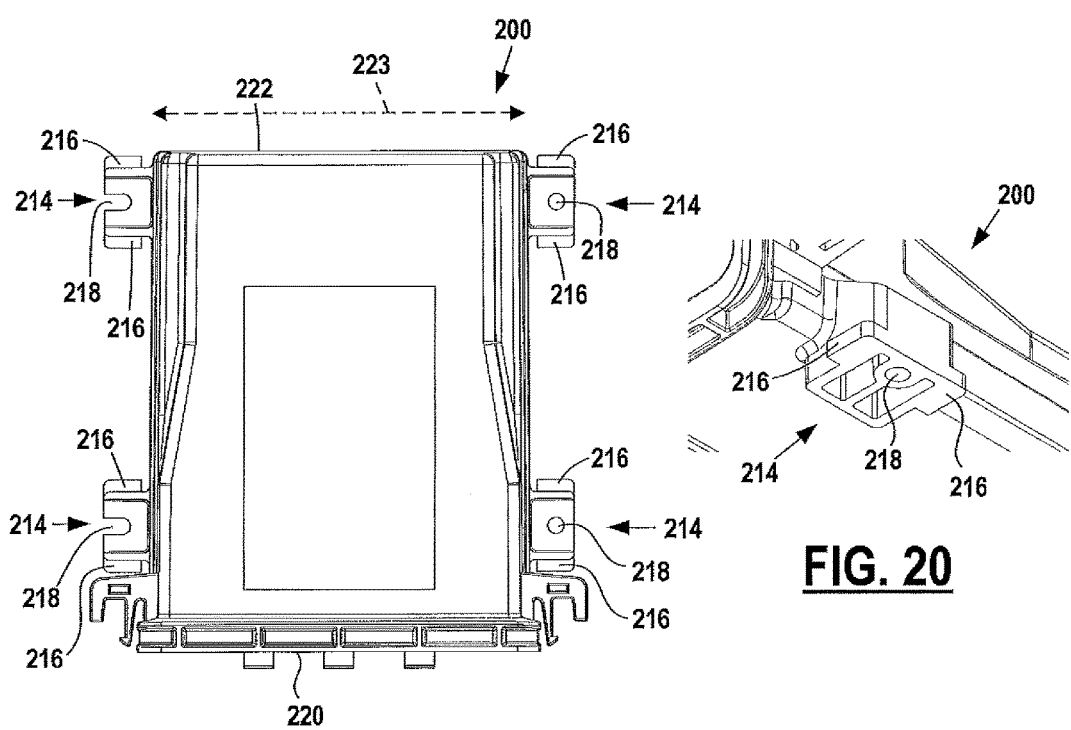
FIG. 19
FIG. 20

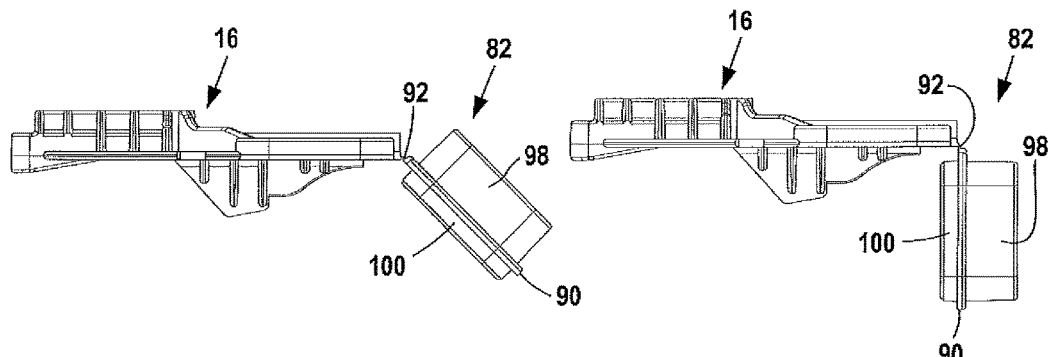
FIG. 27
FIG. 28
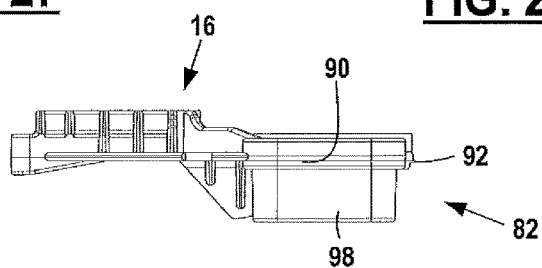
FIG. 29
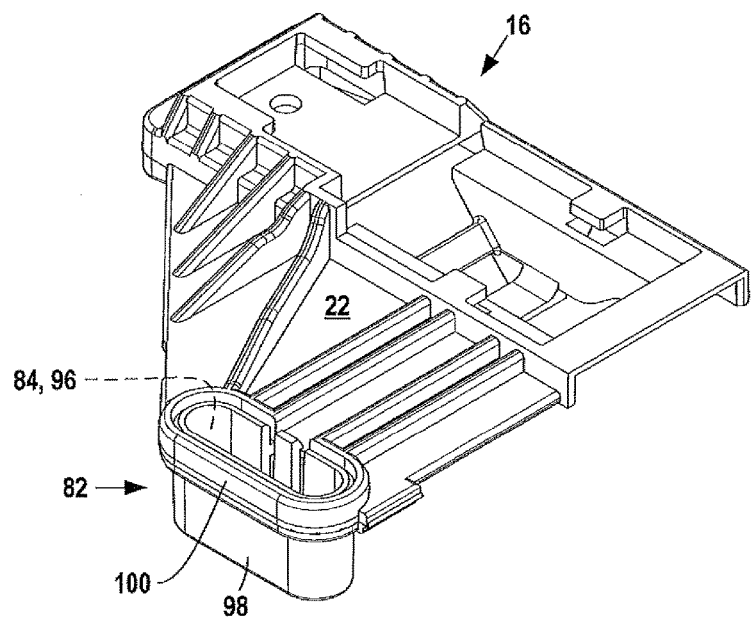
FIG. 30

ENCLOSURE MOUNTING ASSEMBLY

FIELD OF THE DISCLOSURE

The disclosure relates to assemblies for mounting electrical component enclosures on supports. In particular, the disclosure relates to assemblies for securing different types of electrical component enclosures on support poles of different diameters or on flat support walls.

BACKGROUND OF THE DISCLOSURE

Electrical components, typically circuit boards with printed circuits and electronic components on the boards are installed in environmentally and electrically protective enclosures. It is well-known to mount these enclosures in exposed locations on poles or on flat support walls.

Conventional mounting assemblies do not permit secure mounting of the assembly with supported electrical components on different sized poles or on flat support surfaces. Additionally, conventional mounting assemblies cannot be used to mount different size enclosures required for different size electrical components. Typically a specific mounting assembly is required for each size enclosure.

Compounding enclosure size issues, an enclosure may have to be mounted on different diameter poles. These problems require a stock of different support structures adapted for use with different enclosures with may be secured on walls or on poles.

Additionally, securing enclosures to different supports requires fastener hardware such as bolts, screws and the like that must be maintained in stock.

Thus, it is desirable to provide a single assembly for mounting different size enclosures to different size poles or flat support walls. The assembly should permit easy securing of the enclosure to the assembly without using separate fastener hardware.

BRIEF SUMMARY OF THE DISCLOSURE

An improved enclosure mounting assembly for mounting enclosures to poles and/or flat support walls is disclosed. The assembly supports different size enclosures and can be installed on poles having different diameters or on flat support walls. The enclosure is secured to the assembly without the need for additional fastener hardware.

The disclosed enclosure assembly includes two bodies that are movable relative to each other. An enclosure face on the assembly has enclosure-engagement elements that allow securing the enclosure to the assembly without additional fastener hardware. The assembly bodies are moved relative to each other to accommodate different size enclosures.

The assembly bodies include engagement members which engage the outer circumferences of different diameter poles during mounting. The enclosure also has a flange mount assembly that allows mounting the assembly to a flat support wall as needed.

Other objects and features will become apparent as the description proceeds, especially when taken in conjunction with the accompanying drawing sheets.

BRIEF DESCRIPTION OF THE DRAWINGS

FIG. 18 is a perspective view of an electrical component enclosure for use with the enclosure mounting assembly;

FIG. 19 is a top view of the enclosure of FIG. 18;

FIG. 20 is a bottom perspective detail view of the enclosure of FIG. 18;

FIGS. 27-29 are top views of the assembly first body showing use of the assembly mounting flange;

FIG. 30 is a perspective view of the assembly first body showing use of the assembly mounting flange;

DETAILED DESCRIPTION

Figure 1:
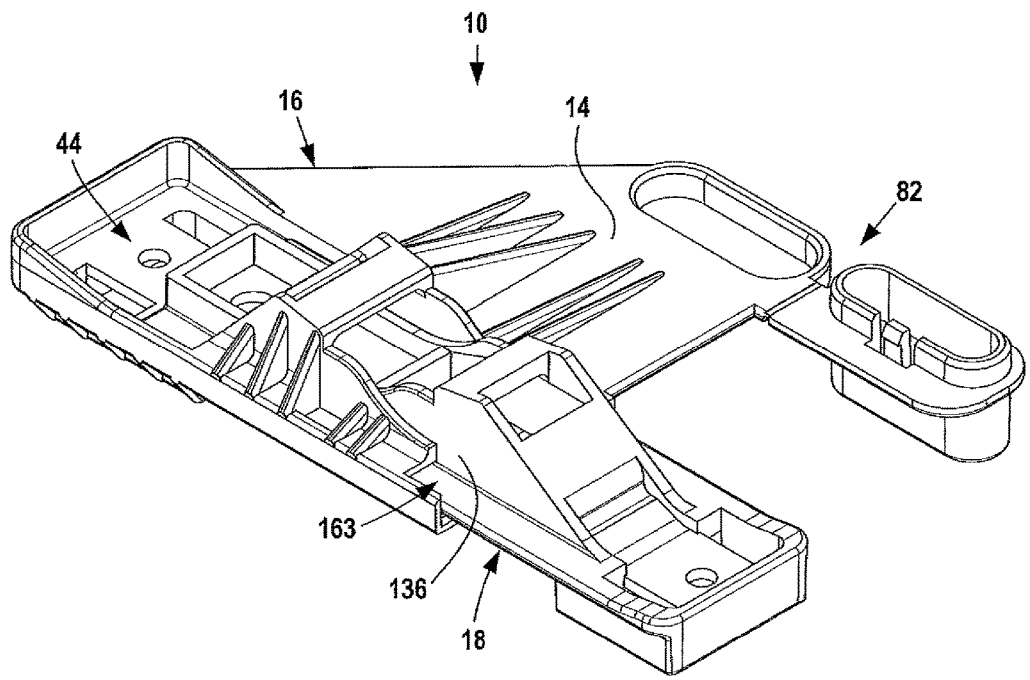
FIG. 1 is a rear perspective view of the enclosure mounting assembly.
Figure 2:
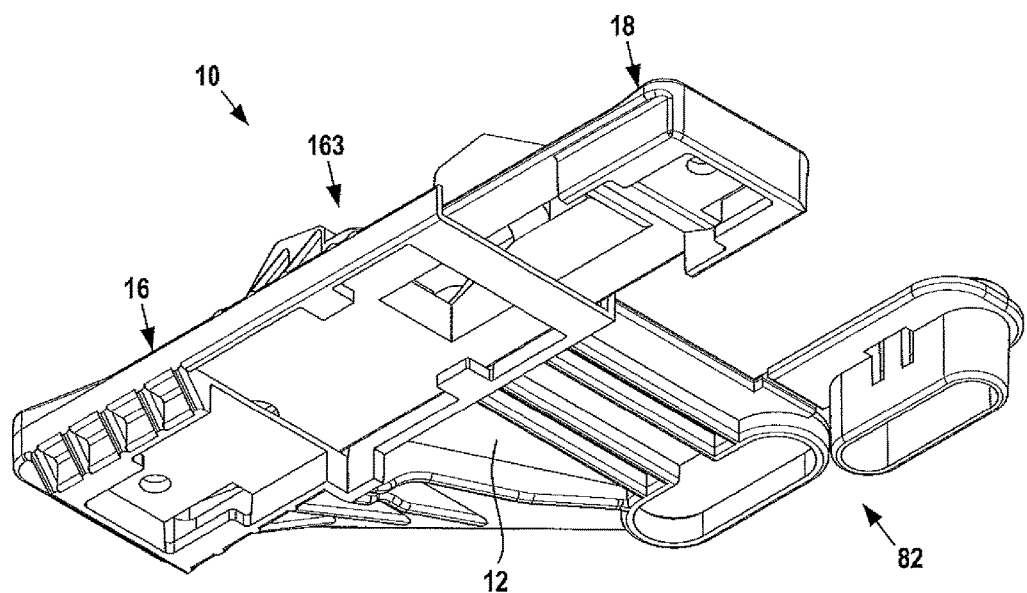
FIG. 2 is a front perspective view of the assembly.

FIGS. 1 and 2 show an enclosure mounting assembly 10 having two member bodies 16 and 18. Assembly 10 has a generally flat shape with an enclosure face 12 and an opposed support mounting face 14. Body 16 is illustrated in FIGS. 3-9. Body 18 is illustrated in FIGS. 10-13. Bodies 16 and 18 may be molded from conventional plastic resin.

Figure 3:
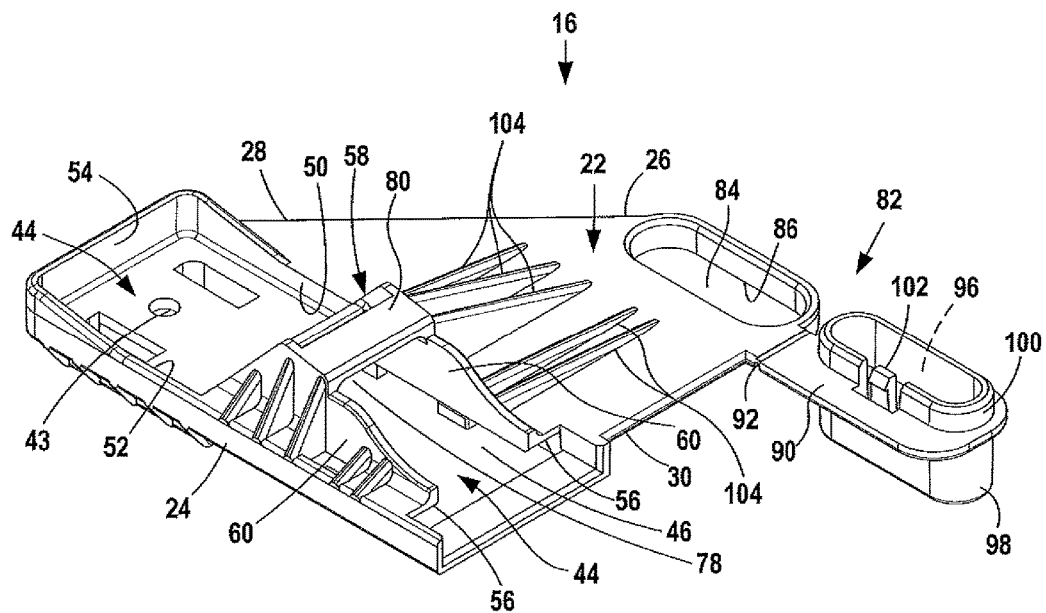
FIG. 3 is a rear perspective view of the assembly first body member.
Figure 4:
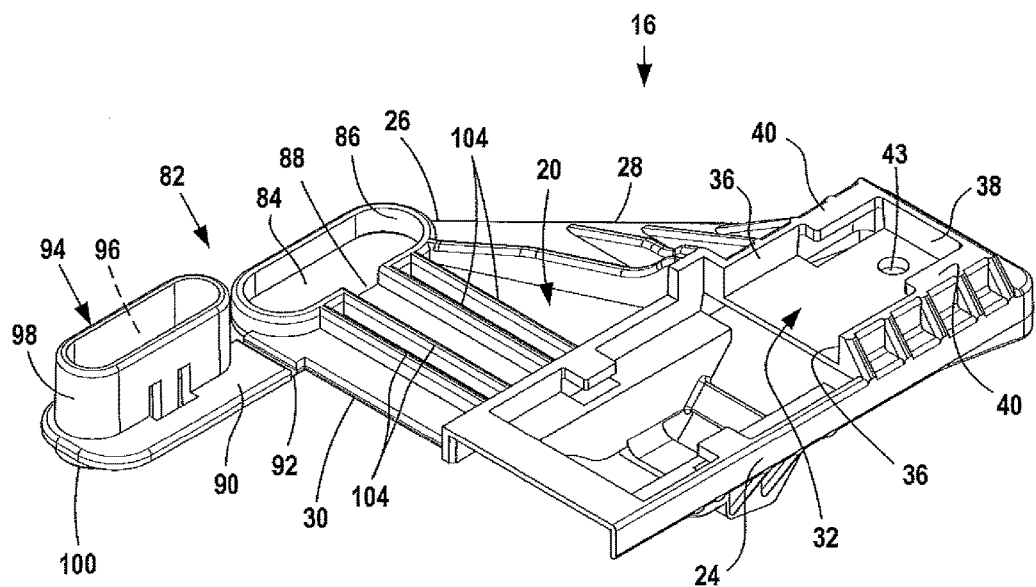
FIG. 4 is a front perspective view of the assembly first body member.
Figure 5:
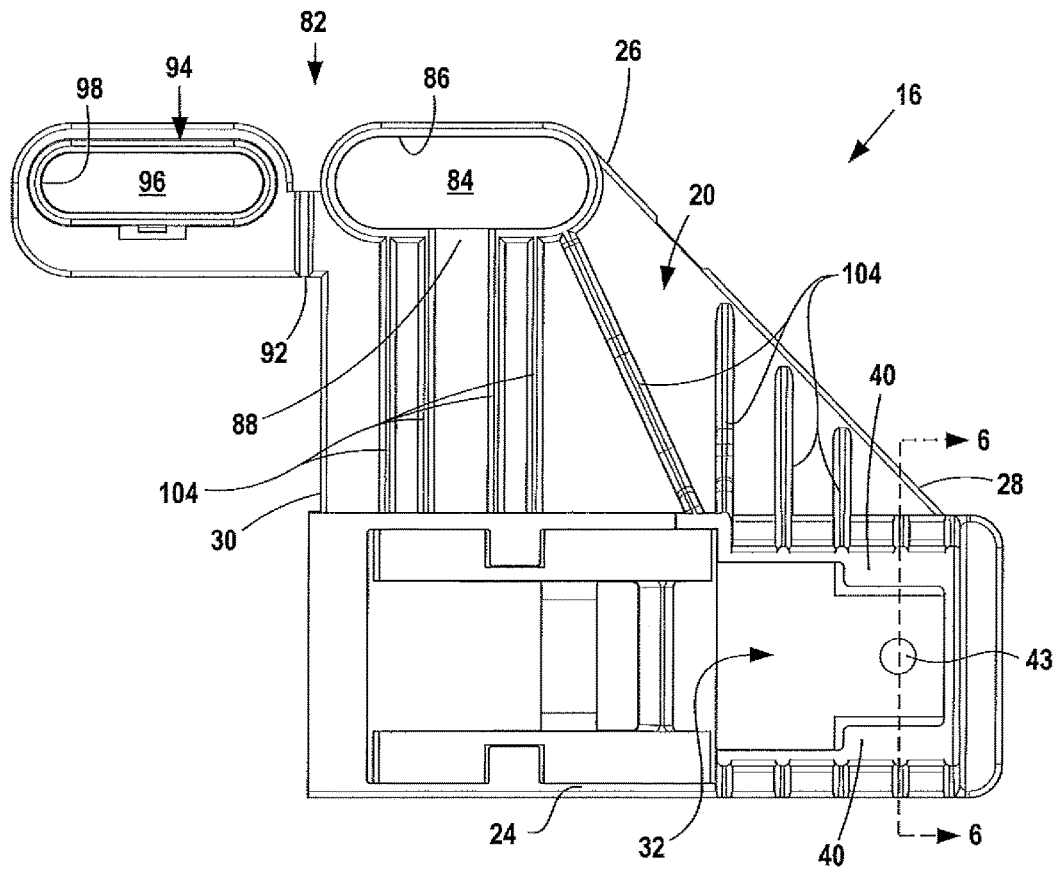
FIG. 5 is a front view of the assembly first body member.

As shown in FIGS. 3-4, first member body 16 is generally flat, having opposed enclosure and support mounting faces 20, 22. First body 16 extends from body bottom 24 to body top 26 and from body outer side 28 to body inner side 30. While faces 20, 22 are shown in the figures as having the shape of an irregular pentagon, other shapes are possible.

Figure 6:
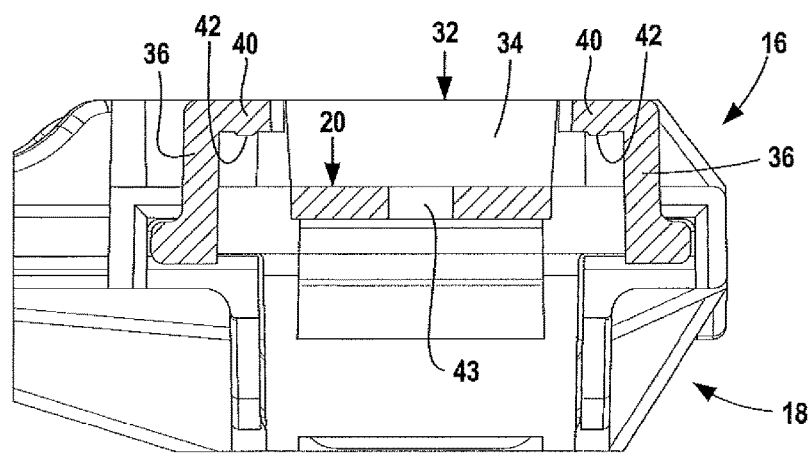
FIG. 6 is a sectional view taken along line 6-6 of FIG. 5.
Figure 7:
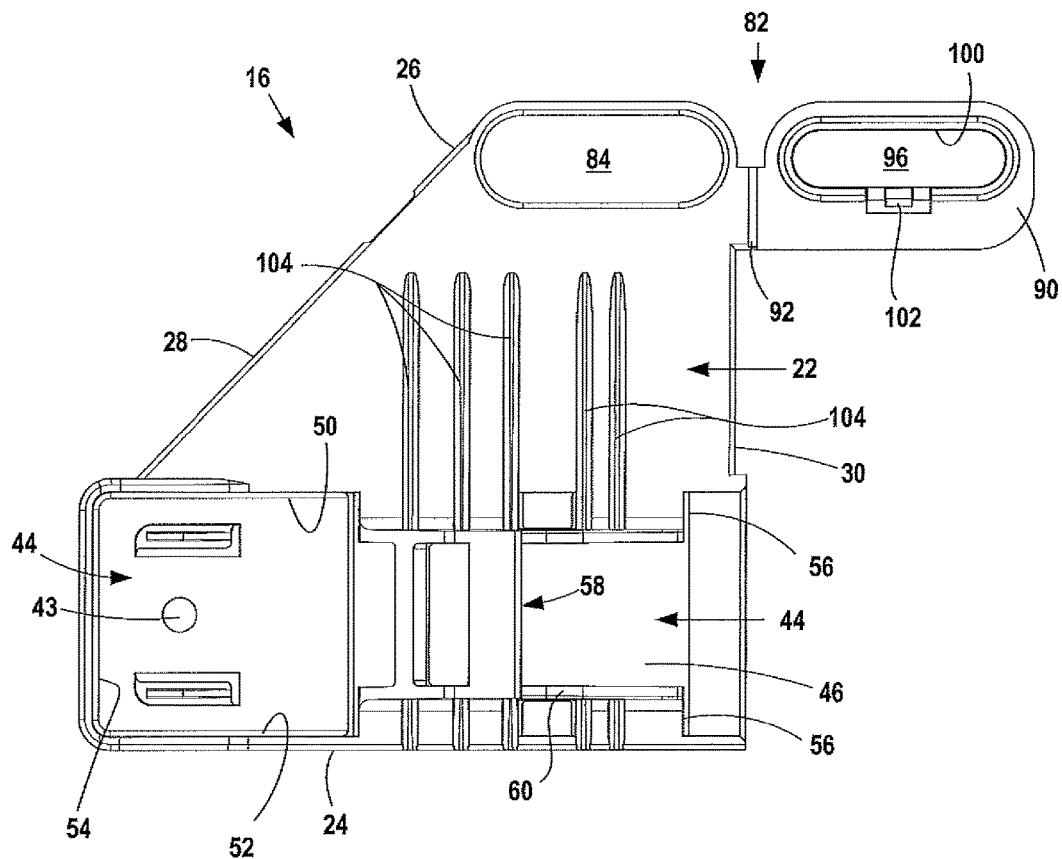
FIG. 7 is a rear view of the assembly first body member.
Figure 8:
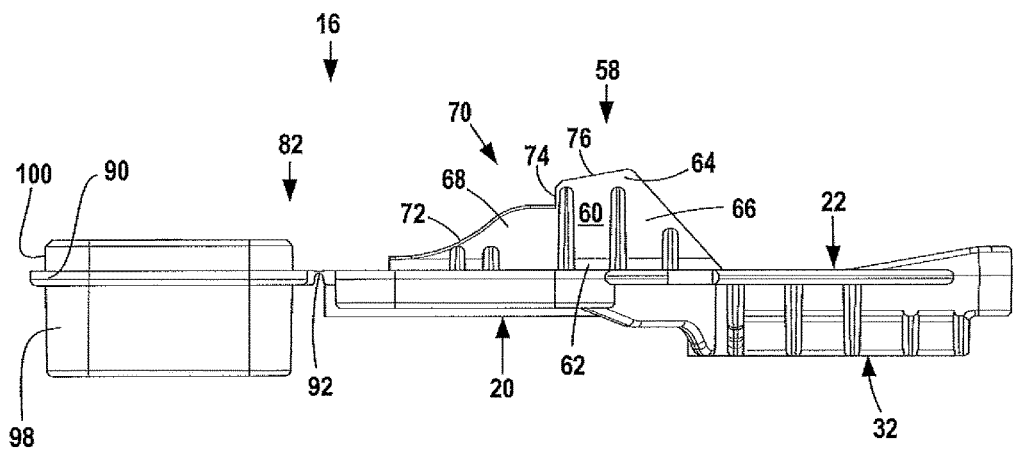
FIG. 8 is a top view of the assembly first body member.
Figure 9:
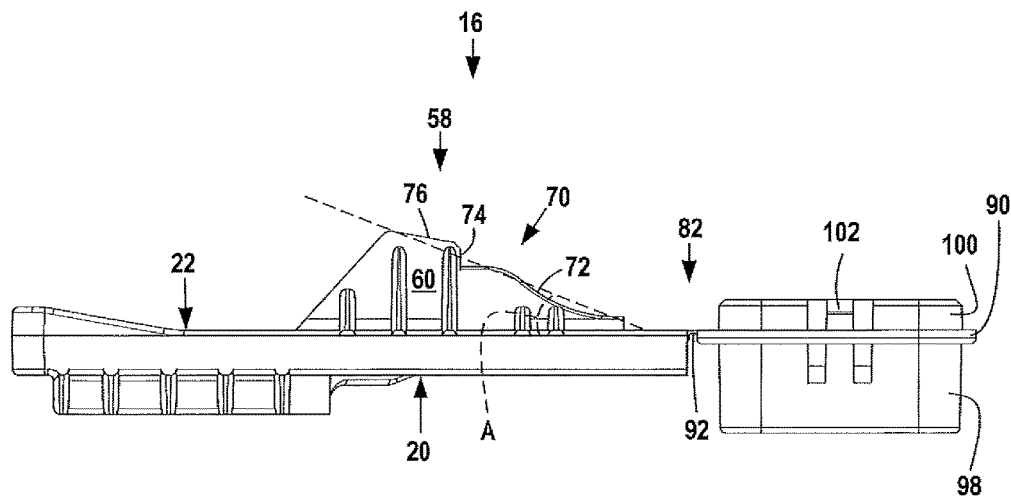
FIG. 9 is a bottom view of the assembly first body member.
Figure 10:
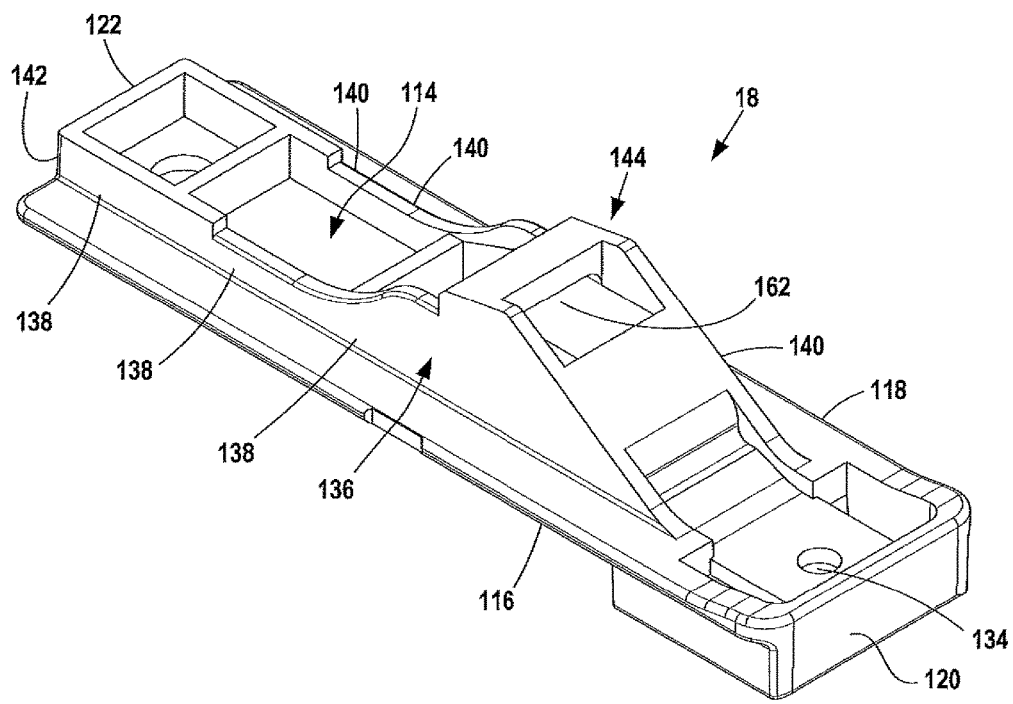
FIG. 10 is a rear perspective view of the assembly second body member.
Figure 11:
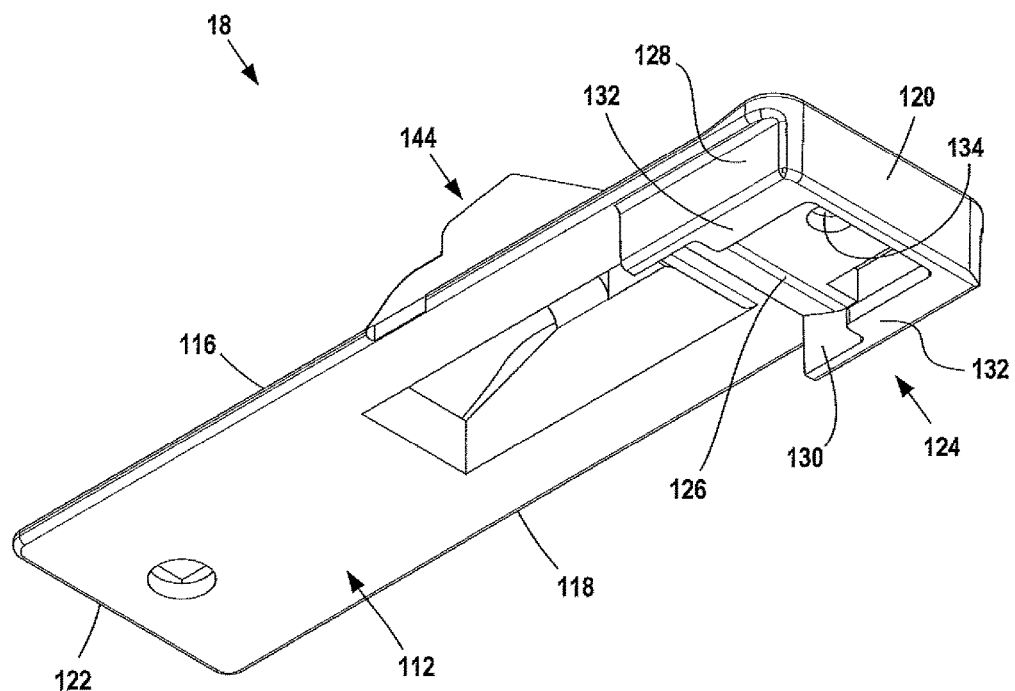
FIG. 11 is a front perspective view of the assembly second body member.
Figure 12:
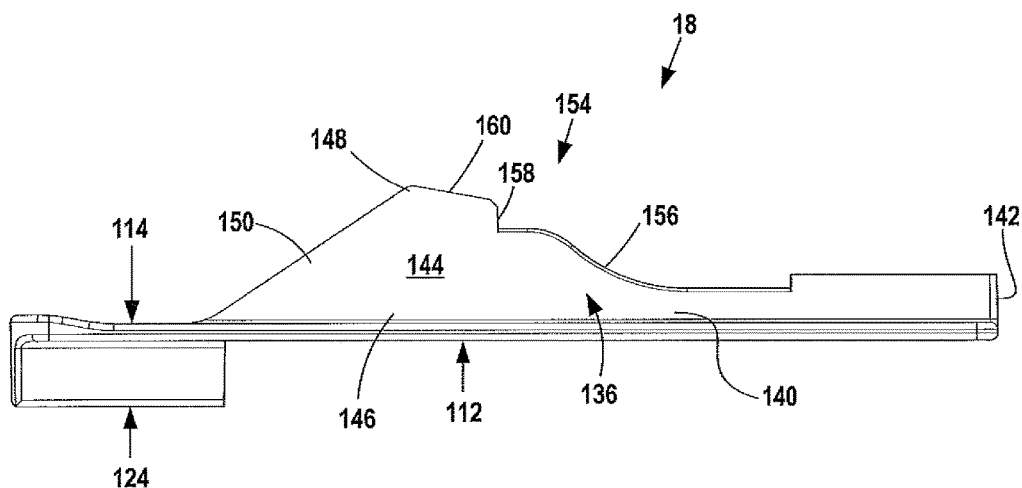
FIG. 12 is a bottom view of the assembly second body member.
Figure 13:
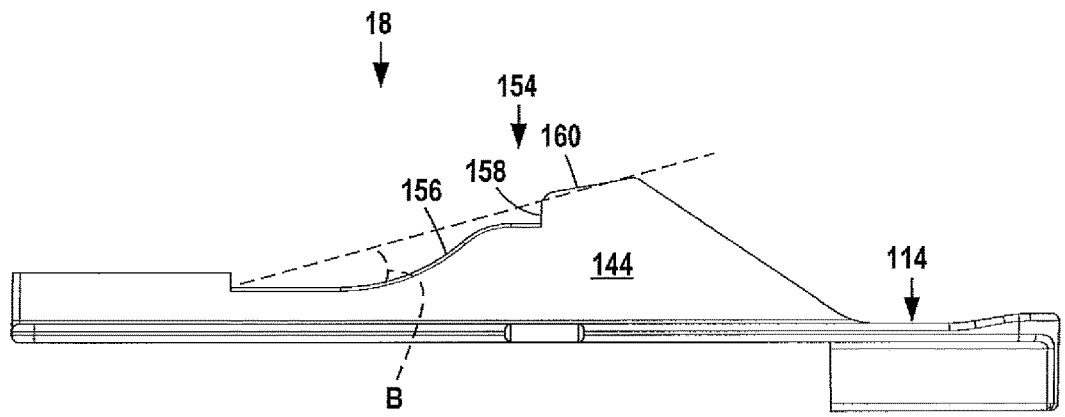
FIG. 13 is a top view of the assembly second body member.

First body 16 enclosure face 20 has an enclosure engagement element 32 proximate body bottom 24 and body outer side 28. Engagement element 32 has a slot recess 34 generally defined by walls 36, 38 extending away from face 20 and lips 40 overlying face 20. Each lip 40 includes a rib 42 extending from lip 40 and into recess 34 as shown in FIG. 6.

Enclosure engagement element 32 may include an engagement aperture 43 extending through body 16.

First body 16 support mounting face 22 has slide channel 44 proximate body bottom 24. Channel 44 extends along body 16 between sides 28, 30. Channel 44 has a channel recess 46 generally defined by channel side walls 50, 52, end wall 54 and lips 56 overlying face 22.

First body support mounting face 22 also has a first mounting member 58. Member 58 is made up of two mounting sub-members 60. Each sub-member 60 is generally flat and fin-shaped. Sub-members 60 are substantially similar to each other having similar shapes in profile and located apart from each other across channel 44 as shown in FIG. 3. While sub-members are shown in the figures as generally triangular, other shapes are possible.

Each sub-member 60 extends from a base portion 62 proximate face 22 to a crown portion 64 away from face 22 and from sub-member outer side 66 to sub-member inner side 68.

Sub-member inner side 68 has a support member engagement surface 70 extending from base portion 62 to crown portion 64. Surface 70 has the shape of a non-continuous curve, with a S-curve section 72, a stop section 74 and a linear section 76. Support member engagement surface 70 extends generally away from base portion 62 to crown portion 64 at an acute, angle A of less than 90 degrees. See FIG. 9.

First body support mounting face 22 also has a band aperture 78 proximate crown portion 64. Band aperture 78 is generally defined by face 22, sub-members 60 and beam 80 extending between sub-members 60.

Flange mounting assembly 82 is located proximate body top 26. Assembly 82 has a body aperture 84 extending through body 16. Retention collar 86 surrounds aperture 84 and extends away from enclosure face 20. Collar 86 has a latch recess 88. Assembly 82 also has flange tab 90 joined to body 16 by hinge 92. Flange tab 90 is generally flat and has mounting flange 94 extending through tab 90. Flange 94 has a flange aperture 96 defined by surrounding flange walls 98, 100 which extend away from both sides of tab 90. Flange latch 102 is located adjacent flange wall 100 and extends away from flange tab 90 and face 22 as shown in FIG. 3.

Hinge 92 may be a living hinge, comprised of the same material as flange tab and body 16.

First member body 16 has a number of structural gussets 104 on faces 20, 22 to improve body rigidity.

Second member body 18 is generally flat, having opposed enclosure and support mounting faces 112, 114. Second body 18 extends from body bottom 116 to body top 118 and from body outer side 120 to body inner side 122. While faces 112, 114 are shown in the figures as rectangular, other shapes are possible.

Second body 18 enclosure face 112 has an enclosure engagement element 124 proximate body outer side 120. Engagement element 124 is essentially identical to above-described engagement element 32. Engagement element 124 has a slot recess 126 generally defined by walls 128, 130 extending away from face 112 and lips 132 overlying face 112. Lips 132 include a rib like above-described rib 42 extending from each lip 132 and into recess 126.

Engagement element 124 may include an engagement aperture 134 extending through body 18.

Second body support mounting face 114 includes slide member 136. Member 136 extends substantially between body sides 120, 122 and is generally rectangular, having slide side walls 138, 140 and slide end wall 142. As discussed below, slide member 136 is adapted to engage above-described slide channel 44 on body 16.

Second body support mounting face 114 also has a second mounting member 144. Member 144 has a unitary body, extending from a base portion 146 proximate face 114 to a crown portion 148 away from face 114 and from member outer side 150 to member inner side 152.

Member inner side 152 has a support member engagement surface 154 extending from base portion 146 to crown portion 148. Surface 154 has the shape of a non-continuous curve with an S-curve section 156, a stop section 158 and a linear section 160. Support member engagement surface 154 extends generally away from base portion 146 to crown portion 148 at an acute angle B. See FIG. 13.

While member 144 is shown in the figures as having a generally triangular shape, other shapes are possible.

Support member engagement surface 154 may have a symmetrically similar or identical profile shape as support member engagement surface 70. Above-described acute Angles A and B may likewise be similar or identical.

Band aperture 162 extends through second mounting member 144 proximate crown portion 148 and facing body sides 120 and 122. See FIG. 10.

Figure 14:
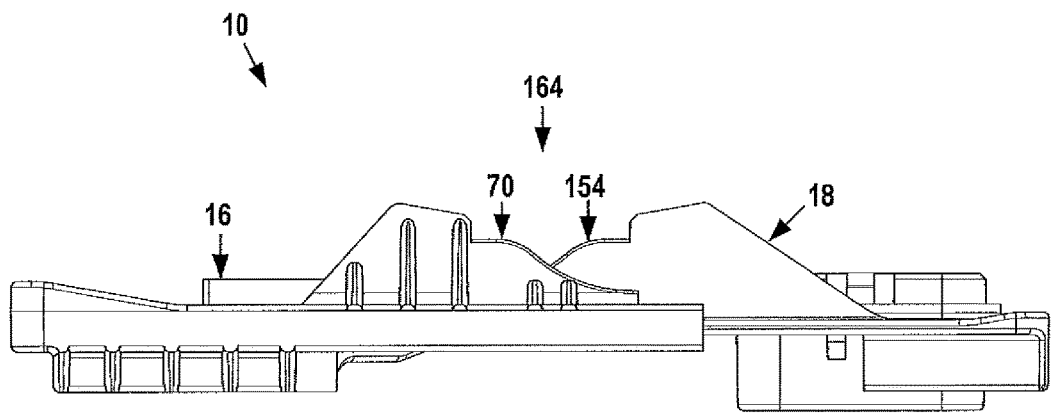
FIG. 14 is a top view of the assembly.
Figure 15:
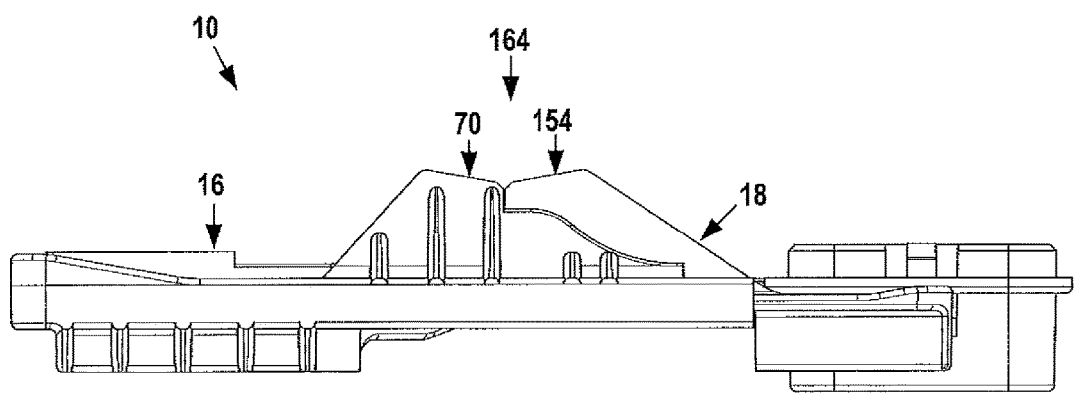
FIG. 15 is a top view of the assembly in an alternate configuration.
Figure 16:
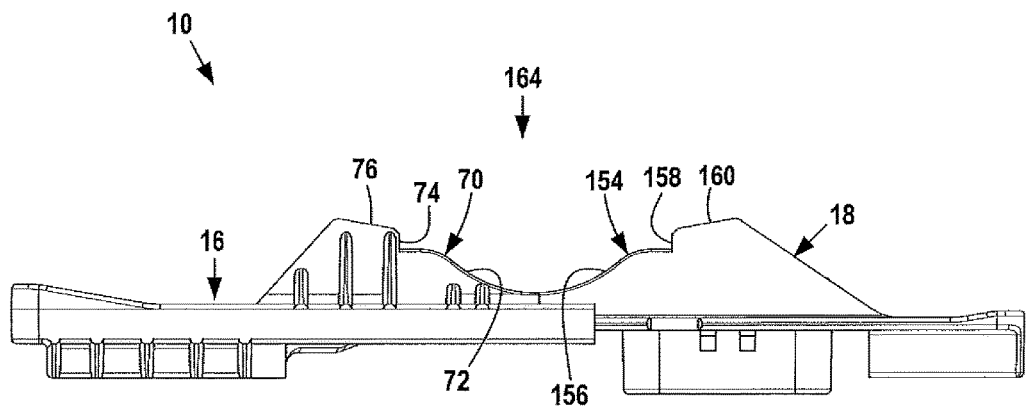
FIG. 16 is a top view of the assembly in a further alternate configuration.

First body 16 and second body 18 are placed proximate one another and assembled together to form assembly 10. Assembly is formed by placing second body positioning slide member 136 within slide channel 44. Slide member 136 and slide channel 44 form assembly slide connection 163. See FIGS. 1-2. Slide connection 163 allows bodies 16, 18 to be positioned relative one to place assembly 10 into different configurations. FIG. 14 shows assembly 10 in an example medium configuration. FIG. 15 shows assembly 10 in an example small configuration. FIG. 16 shows assembly 10 in an example large configuration. Different assembly configurations allow assembly 10 to mount different sized electrical enclosures.

As slide 136 is placed within channel 44, second body mounting member 144 is located between first body sub-members 60.

Assembly mounting profile 164 is made up of the overlapping pole engagement surfaces 70, 154 on member bodies 16 and 18 respectively. Profile 164 is generally V-shaped.

Profile 164 is made up of symmetrical S-curve sections 72, 156, stop sections 74, 158 and linear sections 76, 160 on pole engagement surfaces 70, 154 determined by the position of first and second bodies 16, 18 as assembly 10 is moved into different configurations.

As assembly 10 is moved to different configurations, mounting profile 164 changes as profile 164 expands or collapses as shown in FIGS. 14, 15 and 16. For example, in the FIG. 15 example small assembly configuration, profile 164 is made up of linear sections 76, 160. In the FIG. 14 example medium assembly configuration, profile 164 is made up of linear sections 76, 160, stop sections 74, 158 and portions of S-curve sections 72, 156. In the FIG. 16 example large assembly configuration, profile 164 is made up of linear sections 76, 160, stop sections 74, 158 and S-curve sections 72, 156. Assembly mounting profiles 164 allow secure mounting of the assembly to pole supports as explained in greater detail below.

Applicant notes that the illustrated small, medium and large configurations for assembly 10 are examples. The sliding relationship between bodies 16, 18 allow assembly 10 to be placed in other size configurations.

Figure 17:
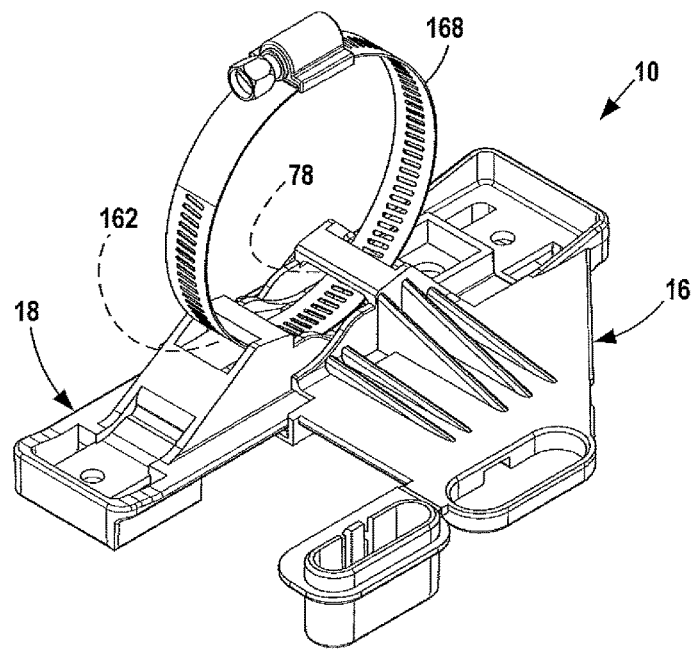
FIG. 17 is a perspective view of the assembly with a mounting band.

In assembly 10, first body band aperture 78 and second body band aperture 162 are located adjacent each other on assembly support mounting face 14. This allows a user to locate a conventional band 168 or like flexible fastener through apertures 78, 162. Band 168 is used to mount assembly 10 to a pole as explained in greater detail below. See FIG. 17.

Use of enclosure mounting assembly 10 will now be described.

Enclosure mounting assembly 10 is used to mount electrical enclosures of different sizes to a pole support or flat support wall. An example electrical enclosure 200 for use with assembly 10 is shown in FIGS. 18-20.

Enclosure 200 has a generally rectangular enclosure body 210 with a recess 212 for housing PCBs and/or other electrical components.

The bottom of body 210 includes four enclosure feet 214 located proximate each corner of body 210. Each foot 214 is rectangular and has opposed flanges 216. Flanges 216 are located at the bottom of each foot 214 are generally flat.

Foot 214 may have a foot aperture 218 extending there through.

A first pair of enclosure feet 214 is located on front end 220 of enclosure 200. A second pair of enclosure feet 214 is located on back end 222 of enclosure 200.

Figure 22:
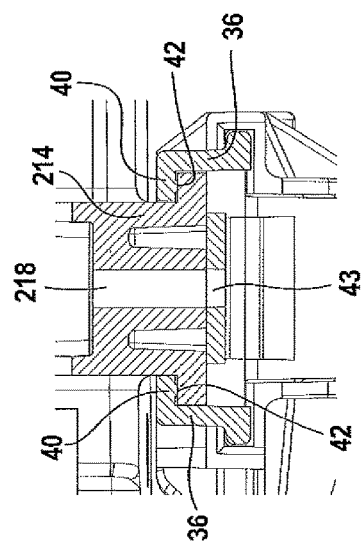
FIG. 22 is a sectional view taken along line 22-22 of FIG. 21.

Enclosure 200 is installed to assembly 10 by placing an enclosure foot 214 into an enclosure engagement element 32, 124 on assembly body 16, 18. Elements 32, 124 accommodate foot 214 so that opposed flanges 216 fit within slot recesses 34, 126. A foot 214 is secured within engagement slots 32, 124 by an interference fit with ribs 42. See FIG. 22. Ribs 42 may be deformed or crushed at flange 216 insertion to secure foot 214 to assembly 10.

Alternatively, a conventional fastener may be extended through an aligned engagement aperture 43, 134 on bodies 16, 18 and foot aperture 218.

Installation of enclosure 200 onto assembly 10 restricts motion of bodies 16, 18 along assembly slide connection 163. Installation to enclosure 200 holds bodies 16, 18 in place relative to each other and prevents assembly 10 from being moved into different larger or smaller configurations.

Removal of enclosure 200 from assembly 10 allows bodies 16, 18 to move along assembly slide connection 163 so that assembly 10 can be moved into different larger or smaller configurations.

Figure 23:
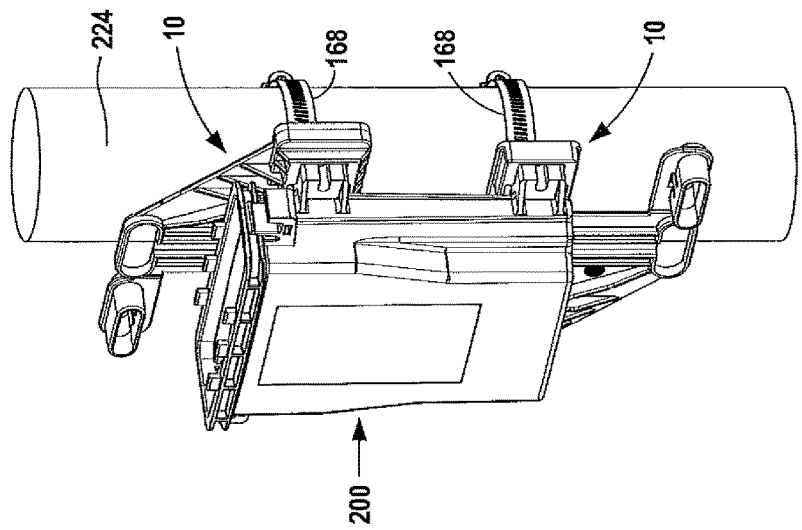
FIG. 23 is a perspective view showing a pair of assemblies with an enclosure installed on a pole.
Figure 21:
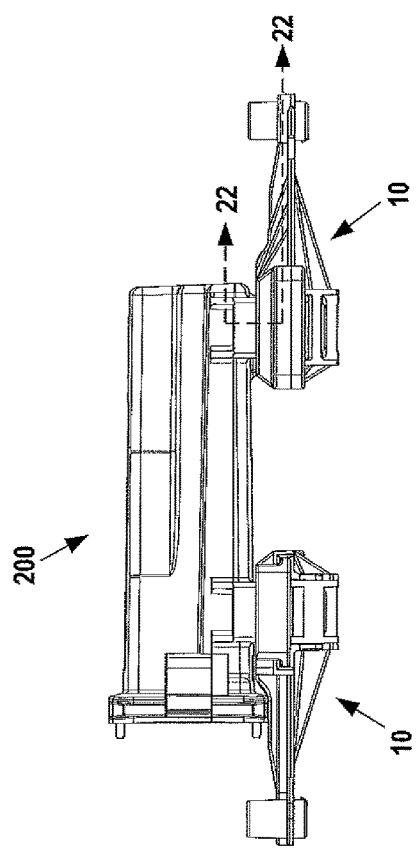
FIG. 21 is a side view of a pair of assemblies with an enclosure.
Figure 25:
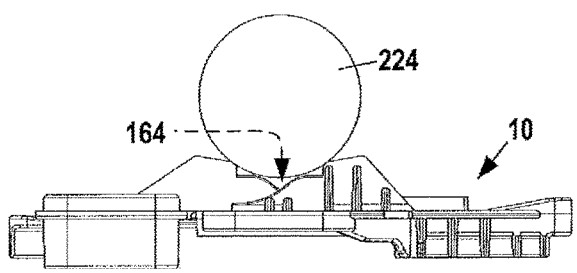

Each assembly 10 is installed onto a pair of enclosure feet 214 located on opposed front and back ends 220, 222 of enclosure 200 as shown in FIGS. 23, 25. One enclosure foot 214 at each end 220, 222 is installed to assembly enclosure engagement slot 32 and the other is installed to assembly enclosure engagement element 124.

Assembly 10 is moved to different sized configurations to accommodate different sized enclosures 200. For instance, for enclosures 200 having a larger assembly width 223, a larger sized assembly configuration is used to properly install assembly enclosure engagement elements 32, 124 to a pair of feet 214. For enclosures 200 having a smaller assembly width 223, a smaller sized assembly configuration is used.

In use, two assemblies 10 are used to mount an enclosure 200 to a support such as a round pole 224 or flat wall. As shown in FIG. 23, assemblies 10 are mounted vertically relative to each other. A band 168 is located through first and second band apertures 78, 162 to mount each assembly to pole 224.

Figure 24:
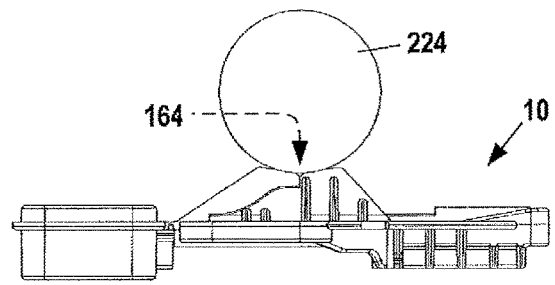
FIGS. 24-26 are top views of the assembly in different configurations mounted to a pole.
Figure 26:
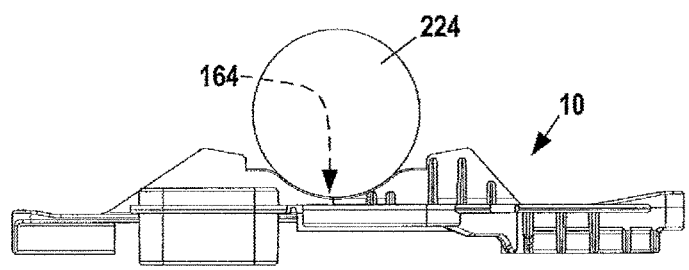
Figure 32:
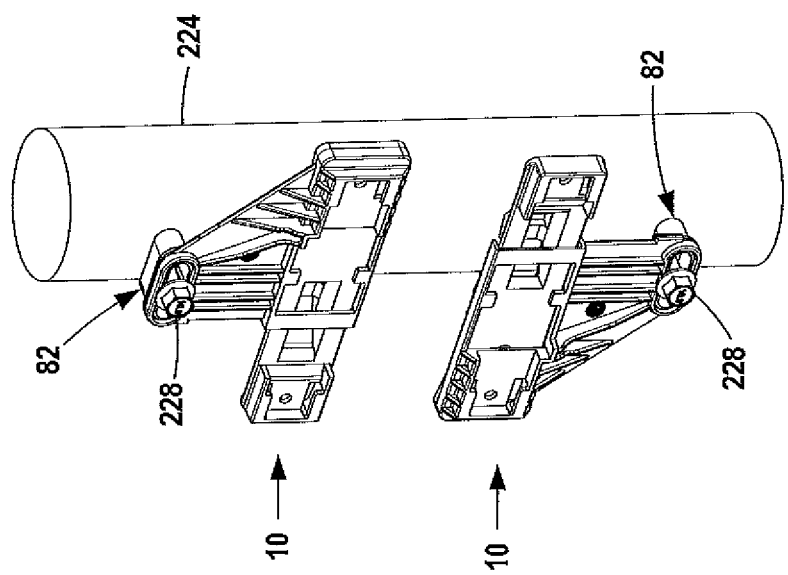
FIG. 32 is a perspective view showing the flange mounting assembly in use with a pole.

FIGS. 24-26 show assembly 10 in different example configurations mounted to poles 224. FIG. 24 shows assembly 10 in an example small configuration. FIG. 25 shows assembly 10 in an example medium configuration. FIG. 26 shows assembly 10 in an example large configuration. Assembly mounting profile 164 effectively engages the outer surface of pole 224 in the FIGS. 24-26 example configurations.

Figure 31:
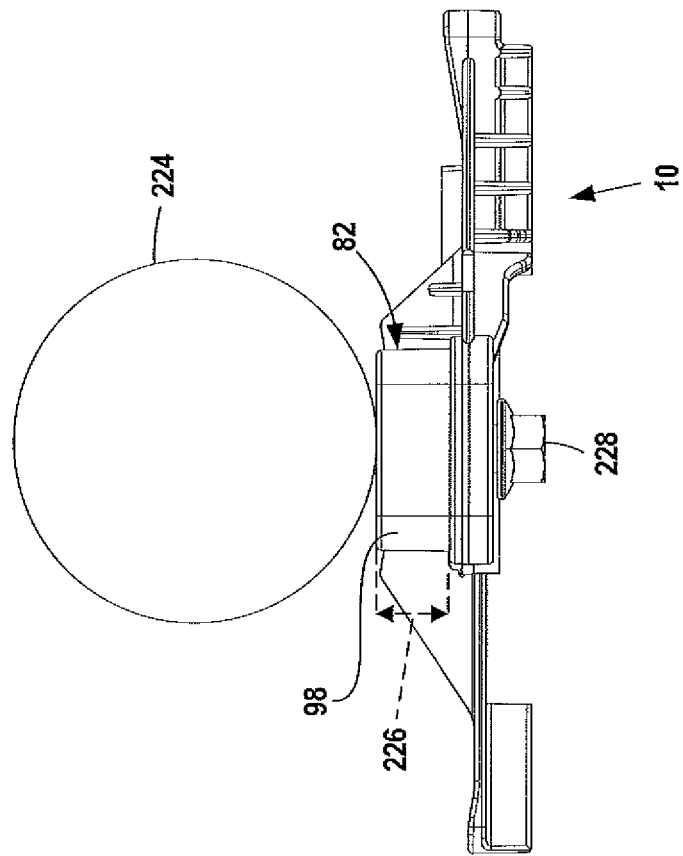
FIG. 31 is a top view showing the flange mounting assembly in use with a pole.

Flange mounting assembly 82 is used to secure assembly 10 to a pole or flat wall through use with a screw, bolt or like fastener. To use assembly 82, first flange tab 90 is turned about hinge 92 to bring flange 94 proximate body aperture 84. See FIGS. 27-29. Flange 94 flange wall 100 is moved to engage body aperture 84 as shown in FIG. 30. In this engaged position, body aperture 84 and flange aperture 100 are aligned and latch 102 engages latch aperture 88. In the engaged position, flange wall 98 extends away from mounting face 14 a distance 226 to provide clearance from first body sub-members 60 and second body mounting member 144 during assembly mounting to a pole or flat wall. See FIG. 31. A fastener 228 is then extended through aligned apertures 84, 96 and into a pole 224 to secure assembly 10 thereto. Flange mounting assembly 82 can likewise be used to secure assembly 10 to a flat wall surface.

While this disclosure discloses and describes various embodiments, it is understood that this is capable of modification and that the disclosure is not limited to the precise details set forth, but includes such changes and alterations as fall within the purview of the following claims.

We claim:

1. An assembly for mounting an electrical component enclosure on a support member, the assembly comprising:
a first body member having an inner side and an outer side, an enclosure face and a support mounting face, the enclosure face of the first body member extending between the inner side and outer side of the first body member and the support mounting face of the first body member extending between the inner side and outer side of the first body member, the enclosure face of the first body member facing away from the support mounting face of the first body member, a first enclosure engagement element on the enclosure face of the first body member and a first support member engagement surface extending from a first body member base portion proximate the support mounting face of the first body member to a first body member crown portion away from the support mounting face of the first body member;
a second body member having an inner side and an outer side, an enclosure face and a support mounting face, the enclosure face of the second body member extending between the inner side and outer side of the second body member and the support mounting face of the second body member extending between the inner side and outer side of the second body member, the enclosure face of the second body member facing away from the support mounting face of the second body member, a second enclosure engagement element on the enclosure face of the second body member and a second support member engagement surface extending from a second body member base portion proximate the support mounting face of the second body member to a second body member crown portion away from the support mounting face of the first body member, the second body member adjacent the first body member;
said first support member engagement surface and said second support member engagement surface comprising an assembly mounting profile away from the support mounting faces of the first and second body members; and a slide connection joining the first and second body members, the slide connection comprising a slide channel on the first body member and a slide member on the second body member, said slide member in said slide channel for relative movement of said body members toward and away from each other, wherein the slide connection permits the assembly to mount different sized component enclosures on the support member.

2. The assembly as in claim 1 wherein the assembly mounting profile is V-shaped.

3. The assembly as in claim 2 wherein the assembly mounting profile comprises non-continuous curves.

4. The assembly as in claim 3 wherein said non-continuous curve comprises an S-curve section and a linear section.

5. The assembly as in claim 1 wherein said support mounting face of the first body member comprises a first mounting member, said first support member engagement surface on said first mounting member and support mounting face of the second body member comprises a second mounting member, said second support member engagement surface on said second mounting member.

6. The assembly as in claim 1 wherein the assembly mounting profile is curved.

7. An assembly for mounting an electrical component enclosure on a support member, the assembly comprising:
   a first body member having enclosure and support mounting faces extending along the first body member;
   a first enclosure engagement element on the enclosure face of the first body member and a first support member engagement surface extending from a first body member base portion proximate the support mounting face of the first body member to a first body member crown portion away from the support mounting face of the first body member;
   a second body member having enclosure and support mounting faces extending along the second body member;
   a second enclosure engagement element on the enclosure face of the second body member and a second support member engagement surface on extending from a second body member base portion proximate the support mounting face of the second body member to a second body member crown portion away from the support mounting face of the second body member;
   the second body member adjacent the first body member;
   said first and second support member engagement surfaces comprising an assembly mounting profile away from the support mounting faces of the first and second body members;
   a slide connection joining the first and second body members, the slide connection comprising a slide channel on the first body member and a slide member on the second body member, said slide member in said slide channel for relative movement of said body members toward and away from each other, wherein the slide connection permits the assembly to mount different sized component enclosures on the support member.

8. The assembly as in claim 7 wherein one of the first and second enclosure engagement elements comprises enclosure engagement slots.

9. The assembly as in claim 8, said assembly secured to a rigid component enclosure comprising a foot having a flange, said flange positioned in one of said enclosure engagement slots.

10. The assembly as in claim 9 wherein said flange is rectangular.

11. The assembly as in claim 8 comprising a rib on one of said enclosure engagement slots or a flange wherein said rib secures said flange within said enclosure engagement slot.

12. The assembly as in claim 7 wherein the assembly mounting profile is V-shaped.

13. The assembly as in claim 7 wherein the assembly mounting profile is curved.

14. The assembly as in claim 7 wherein the assembly mounting profile comprises non-continuous curves.

15. An assembly for mounting an electrical component enclosure on a support member, the assembly comprising:
   a first body member having enclosure and support mounting faces extending along the first body member;
   a first enclosure engagement element on the enclosure face of the first body member and a first support member engagement surface extending away from the support mounting face of the first body member;
   a second body member having second enclosure and support mounting faces extending along the second body member;
   a second enclosure engagement element on the enclosure face of the second body member and a second support member engagement surface on extending away from the support mounting face of the second body member;
   the second body member adjacent the first body member;
   slide connection means joining the first and second body members; and
   one of the first or second body members comprising a flange mounting assembly, said flange mounting assembly comprising a body aperture extending through said first or second body member and a flange tab joined to said first or second body member by a hinge, the flange tab comprising a flange tab aperture extending through said flange tab.

16. The assembly as in claim 15 wherein said flange tab comprises a flange wall.

17. The assembly as in claim 16 wherein said flange wall surrounds said flange tab aperture.

18. The assembly as in claim 15 wherein one of said first or second body member and said flange tab comprises a latch.

19. An assembly for mounting an electrical component enclosure on a support member, the assembly comprising:
   a first body member having an enclosure face on one side of the first body member and a support mounting face on another side of the first body member, said support mounting face of the first body member facing away from the enclosure face of the first body member;
   a second body member having an enclosure face on one side of the second body member and a support mounting face on another side of the second body member, said support mounting face of the second body member facing away from the enclosure face of the second body member;
   the enclosure mounting face of the first body member comprising a first enclosure engagement element;
   the enclosure mounting face of the second body member comprising a second enclosure engagement element;
   the support mounting face of the first body member comprising a first mounting member extending away from the support mounting face of the first body member, the first mounting member comprising a first support member engagement surface;
   the support mounting face of the second body member comprising a second mounting member extending away from the support mounting face of the second body member, the second body member comprising a second support member engagement surface;

said first support member engagement surface and said second support member engagement surface comprising an assembly mounting profile; and a slide connection joining the first and second body members, the slide connection comprising a slide channel on the first body member and a slide member on the second body member, said slide member in said slide channel for relative movement of said first and second body members toward and away from each other, wherein the slide connection permits the assembly to mount different sized component enclosures on the support member.

20. The assembly as in claim 19 wherein said assembly mounting profile is continuous.

21. The assembly as in claim 19 wherein one of said first mounting member or said second mounting members is comprised of one or more mounting sub-members.

22. The assembly as in claim 21 wherein said one or more mounting sub-members are flat.

23. The assembly as in claim 19 wherein one of said first mounting member or said second mounting members is triangular in shape.

24. The assembly as in claim 19 wherein said assembly mounting profile is V-shaped.

25. The assembly as in claim 19 wherein said assembly is secured to a first rigid component enclosure in a first assembly configuration, said first assembly configuration having a first assembly mounting profile and wherein said assembly is secured to a second rigid component enclosure in a second assembly configuration, said second assembly configuration having a second assembly mounting profile, and wherein said second assembly mounting profile is different from said first assembly mounting profile.

26. The assembly as in claim 25 wherein said one of said first or second assembly mounting profiles is V-shaped.

* * * * *